(12) United States Patent
Choi et al.

(10) Patent No.: US 9,034,750 B2
(45) Date of Patent: May 19, 2015

(54) METHOD OF FABRICATING A SOLDER-ON-PAD STRUCTURE AND FLIP-CHIP BONDING METHOD USING THE SAME

(71) Applicant: Electronics and Telecommunications Research Institute, Daejeon (KR)

(72) Inventors: Kwang-Seong Choi, Daejeon (KR); Ho-eun Bae, Gyeongsangnam-do (KR); Hyun-cheol Bae, Daejeon (KR); Yong Sung Eom, Daejeon (KR); Su Jeong Jeon, Jeollabuk-do (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 145 days.

(21) Appl. No.: 13/846,057

(22) Filed: Mar. 18, 2013

(65) Prior Publication Data

US 2014/0117070 A1    May 1, 2014

(30) Foreign Application Priority Data

Oct. 30, 2012  (KR) .................... 10-2012-0121515

(51) Int. Cl.
  *H01L 21/00*  (2006.01)
  *B23K 1/20*   (2006.01)
  *H01L 23/00*  (2006.01)
  *B23K 3/06*   (2006.01)

(52) U.S. Cl.
  CPC . *B23K 1/20* (2013.01); *H01L 24/11* (2013.01); *B23K 3/0623* (2013.01)

(58) Field of Classification Search
  None
  See application file for complete search history.

(56) References Cited

U.S. PATENT DOCUMENTS

| 7,837,083 | B2 | 11/2010 | MacKay et al. | |
| 2009/0032962 | A1* | 2/2009 | Hougham et al. | 257/773 |
| 2010/0029074 | A1 | 2/2010 | Mackay et al. | |
| 2012/0211889 | A1* | 8/2012 | Edwards et al. | 257/746 |

FOREIGN PATENT DOCUMENTS

| KR | 10-1232208 B1 | 2/2013 |
| KR | 10-1234597 B1 | 2/2013 |

OTHER PUBLICATIONS

"SAC Lead-Free Solder Alloy" by AIM Corporation.*
"Bumping and Stacking Processes for 3D IC using Fluxfree Polymer" by Kwang-Seong Choi et al.; 2011 Electronic Components and Technology Conference; May 31, 2011.*
"Novel Solder-on-Pad (SoP) Technology for Fine-Pitch Flip Chip Bonding" by Kwang-Seong Choi et al.; 11th International Conference on Electronic Packaging Technology & High Density Packaging, Aug. 16, 2010.*

(Continued)

*Primary Examiner* — Scott B Geyer
*Assistant Examiner* — Evren Seven
(74) *Attorney, Agent, or Firm* — Rabin & Berdo, P.C.

(57) ABSTRACT

A method of fabricating a solder-on-pad structure is provided. The method may include providing a substrate with a pad, coating a solder bump maker including a first resin and a solder powder on the substrate, heating the solder bump maker to a temperature lower than a melting point of the solder powder to aggregate the solder powder on the pad, and removing the first resin.

13 Claims, 8 Drawing Sheets

(56) References Cited

OTHER PUBLICATIONS

Jin Yang et al., "Study of Stencil Printing Technology for Fine Pitch Flip Chip Bumping", Electronic Packaging Technology & High Density Packaging (ICEPT-HDP), Aug. 10-13, 2009, pp. 900-905.

Kwang-Seong Choi et al., "Novel Low-Volume Solder-on-Pad (SoP) Material and Process for Flip Chip Bonding using Au Stud Bumps", 2012 IEEE $62^{nd}$ Electronic Components and Technology Conference (ECTC), May 29-Jun. 1, 2012, pp. 1919-1924.

* cited by examiner

METHOD OF FABRICATING A SOLDER-ON-PAD STRUCTURE AND FLIP-CHIP BONDING METHOD USING THE SAME

CROSS-REFERENCE TO RELATED APPLICATIONS

This U.S. non-provisional patent application claims priority under 35 U.S.C. §119 to Korean Patent Application No. 10-2012-0121515, filed on Oct. 30, 2012, in the Korean Intellectual Property Office, the entire contents of which are hereby incorporated by reference.

BACKGROUND OF THE INVENTION

Example embodiments of the inventive concept relate to a method of fabricating a semiconductor device, and in particular, to a fabricating method of a solder-on-pad structure and flip-chip bonding method using the same.

A semiconductor chip may be mounted on a printed circuit board (PCB). The PCB and the semiconductor chip may be electrically connected to each other using a solder bump and a solder-on-pad structure. The solder-on-pad provides an attachment strength between a solder bump and a pad of semiconductor chip. An underfill may be provided between the semiconductor chip and the PCB to encapsulate the solder bump and the solder-on-pad. In general, the solder-on-pad may be printed on the pad. However, the solder-on-pad may be misaligned to the pad, and this misalignment may lead to delamination of a pad, because metallic elements are easily diffused from a solder bump or stud provided thereon to the pad.

The solder-on-pad may be formed using an electroplating technique. However, since the electroplating technique can be used to form only solder made of binary alloy, it may suffer from low electrical and physical reliability.

SUMMARY

Example embodiments of the inventive concept provide a method capable of fabricating a solder-on-pad structure made of a unitary, binary, or ternary alloy and a flip chip bonding method using the same.

Other example embodiments of the inventive concept provide a method capable of fabricating a solder-on-pad structure with high productivity and a flip chip bonding method using the same.

According to example embodiments of the inventive concepts, a method of fabricating a solder-on-pad structure may include providing a substrate with a pad, coating a solder bump maker including a first resin and a solder powder on the substrate, heating the solder bump maker to a temperature lower than a melting point of the solder powder to aggregate the solder powder on the pad, and removing the first resin.

In example embodiments, the solder powder may include a ternary solder.

In example embodiments, the ternary solder may include SAC305 ($Sn_3Ag_{0.5}Cu$).

In example embodiments, the SAC305 may be heated to 215° C. during the heating of the solder bump maker.

In example embodiments, the method may further include forming a guide exposing the pad on the substrate and determining a height of the solder bump maker.

In example embodiments, the coating of the solder bump maker may be performed by a printing process, and the guide may be used to print the solder bump maker on a specific region of the substrate, where the pad may be provided, during the printing process.

In example embodiments, the solder bump maker may further include a reductant selected to remove a natural oxide layer from surfaces of the solder powder and the pad.

In example embodiments, the method may further include: coating a second resin or a flux on the solder powder, reflowing the solder powder, and removing the second resin or the flux.

In example embodiments, the reflowing of the solder powder may be performed to heat the solder powder to a temperature higher than a melting point thereof.

According to example embodiments of the inventive concepts, a flip-chip bonding method may include providing a substrate with a pad, coating a solder bump maker including a resin and a solder powder on the substrate, heating the solder bump maker to a temperature lower than a melting point of the solder powder to aggregate the solder powder on the pad, reflowing the aggregated solder powder to form a solder bump on the pad, and removing the resin.

In example embodiments, the solder powder may include a ternary solder made of SAC305 ($Sn_3Ag_{0.5}Cu$).

In example embodiments, the SAC305 may be heated to 215° C. during the heating of the solder bump maker.

In example embodiments, the solder powder may be heated to a temperature higher than the melting point during the reflowing of the aggregated solder powder.

In example embodiments, the substrate may include a wafer provided with a trench.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1 through 9 are sectional views illustrating a method of fabricating a solder-on-pad structure according to example embodiments of the inventive concept.

Figure 1:
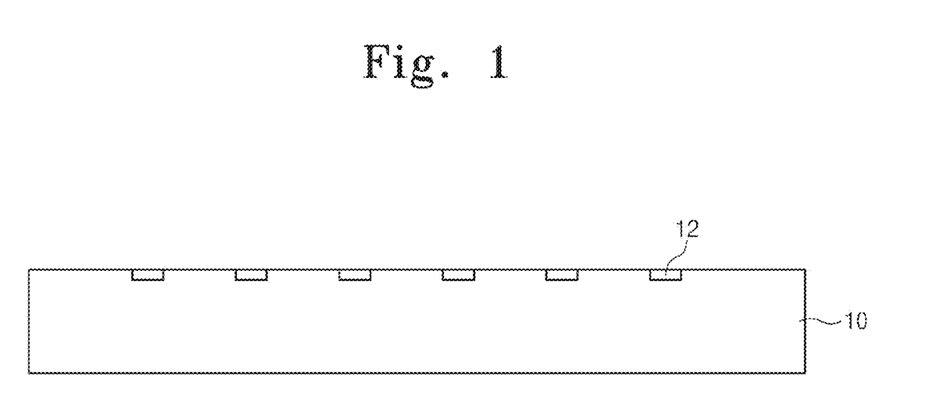
FIGS. 1 through 9 are sectional views illustrating a method of fabricating a solder-on-pad structure according to example embodiments of the inventive concept.

Referring to FIG. 1, a first substrate 10 with a pad 12 is provided. The first substrate 10 may include a silicon chip. The pad 12 may be formed of a metal layer (e.g., of copper or aluminum). The first substrate 10 may include a wafer provided with a trench.

Figure 2:
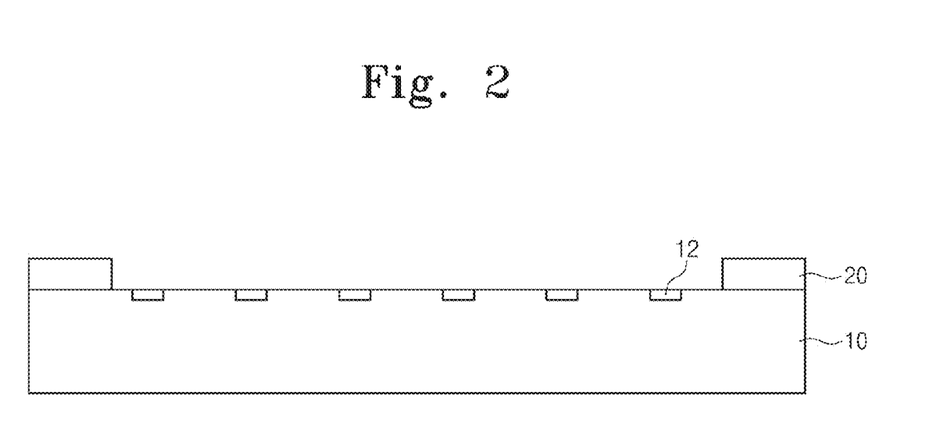

Referring to FIG. 2, a guide 20 may be formed on the first substrate 10 to expose selectively the pad 12. The guide 20 may be provided to form a solder bump maker (e.g., see 30 of FIG. 3), which will be formed by a subsequent process, at a desired level. The guide 20 may include a photoresist pattern.

Figure 3:
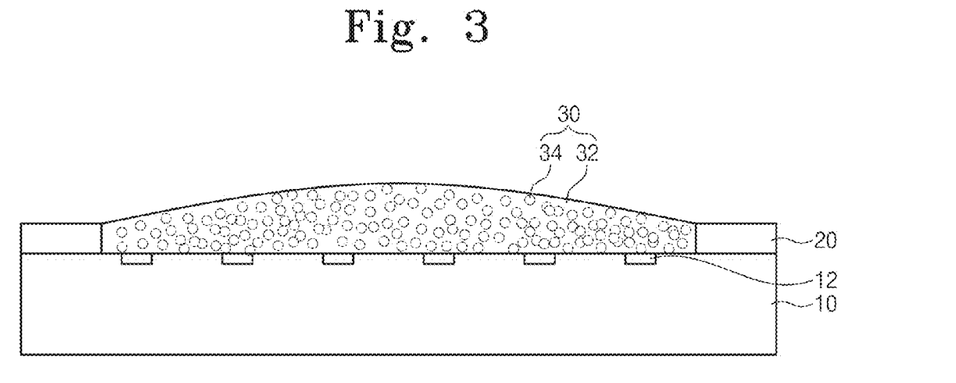

Referring to FIG. 3, a solder bump maker (SBM) 30 may be coated on the first substrate 10. The solder bump maker 30 may include a first resin 32, a solder powder 34, and a reductant (not shown). The first resin 32 may include an epoxy resin and/or a silicon resin. The first resin 32 may be formed of a halogen-free material, but example embodiments of the inventive concept may not be limited thereto. The epoxy resin may include a bisphenol-A-type epoxy resin (e.g., DGEBA), a tetrafunctional epoxy resin (TGDDM), TriDDM, isocyanat, or bismaleimide. The reductant may be provided to remove a natural oxide layer from the solder powder 34 and the pad 12.

For example, the reductant may be an acid containing the carboxyl group (COOH—) and, for example, it may include glutaric acid, malic acid, azelaic acid, abietic acid, adipic acid, ascorbic acid, acrylic acid, or citric acid. The reductant may be provided to have a weight percentage of about 0.01-50 phr, compared to the first resin 32. The solder powder 34 may include a material containing at least one of tin (Sn) or indium (In). For example, the solder powder 34 may include at least one of Sn, In, SnBi, SnAgCu, SnAg, Sn, In, AuSn, or InSn. In other words, the solder powder 34 may include one of various metals, such as unitary, binary, or ternary alloy. The solder powder 34 may be provided to have a volumetric ratio of about 1-50%, compared to the total volume of the solder bump maker 30. The solder powder 34 may be shaped like a plate, a sphere, or a sphere with protrusions. Further, the solder powder 34 may have a particle size defined by IPC's J-STD-005 "Requirements for Soldering Paste". The solder powder 34 may have a diameter that is smaller than about one-fifth of the size of the pad 12. A mean particle size of the solder powder 34 may be strongly correlated with kind and content of the reductant, and thus, the solder powder 34 and the reductant may be adaptively selected in consideration of such correlation.

Figure 4:
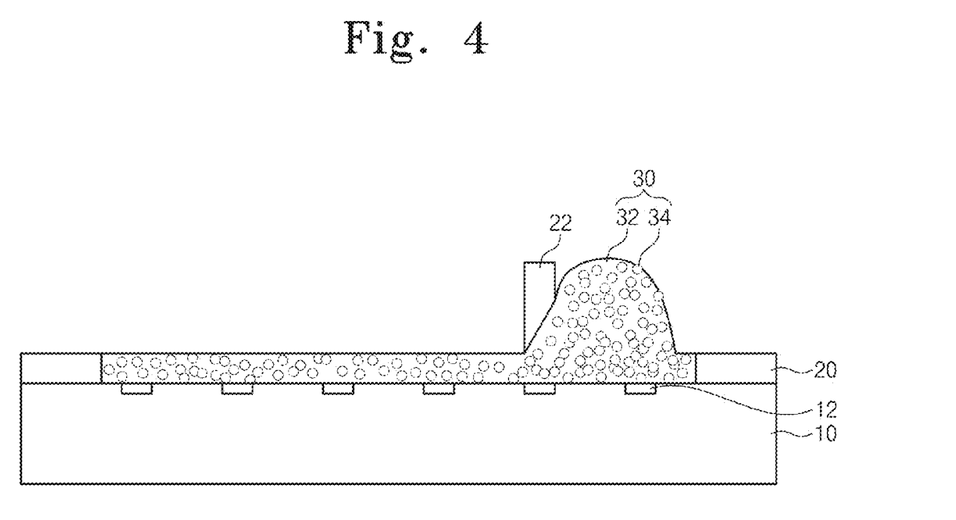

Referring to FIG. 4, the solder bump maker 30 may be removed and planarized by a blade 22. The solder bump maker 30 may be removed by the blade 22 or a squeeze. The blade 22 may be slid on the guide 20 to make a thickness of the solder bump maker 30 uniform.

Figure 5:
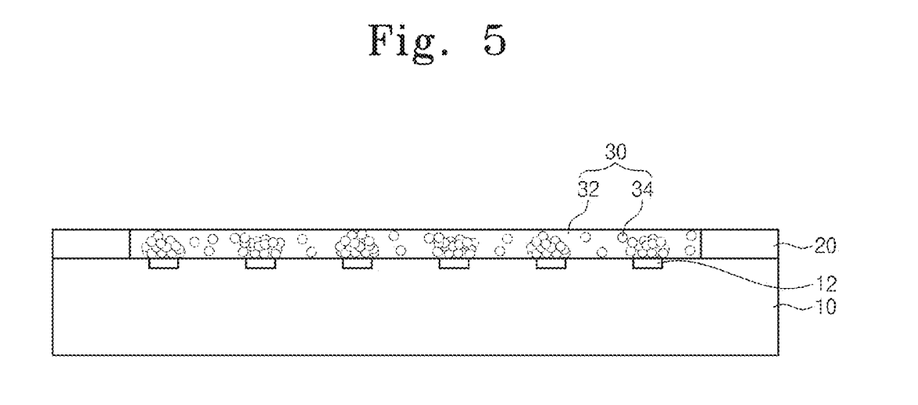

Referring to FIG. 5, the solder bump maker 30 may be heated to a temperature lower than a melting point of the solder powder 34 to aggregate the solder powder 34 on the pad 12. A maximum heating temperature of the solder bump maker 30 may vary depending on kind and quantity of the reductant or an amount of oxygen existing around the solder bump maker 30. For example, the maximum temperature may be inversely proportional to a quantity of the reductant. In example embodiments, the solder powder 34 may be formed of SAC305 ($Sn_3Ag_{0.5}Cu$), and in this case, the maximum heating temperature of the solder bump maker 30 may be about 215° C. The SAC305 has a melting point of about 220° C. In the meantime, the higher the temperature, the lower the viscosity of the first resin 32. Due to the presence of the reductant dissolved in the first resin 32, natural oxide layers may be removed from surfaces of the solder powder 34 and the pad 12. A surface tension between particles in the solder powder 34 and a surface tension between the solder powder 34 and the pad 12 may result in an aggregation of the solder powder 34 on the pad 12. Here, the solder powder 34 may be partially melted by a thermal energy and be spontaneously aggregated on the pad 12. The solder powder 34 may be aggregated to each other by the surface tension between particles therein.

Accordingly, a method of fabricating a solder-on-pad structure according to example embodiments of the inventive concept can improve productivity.

Figure 6:
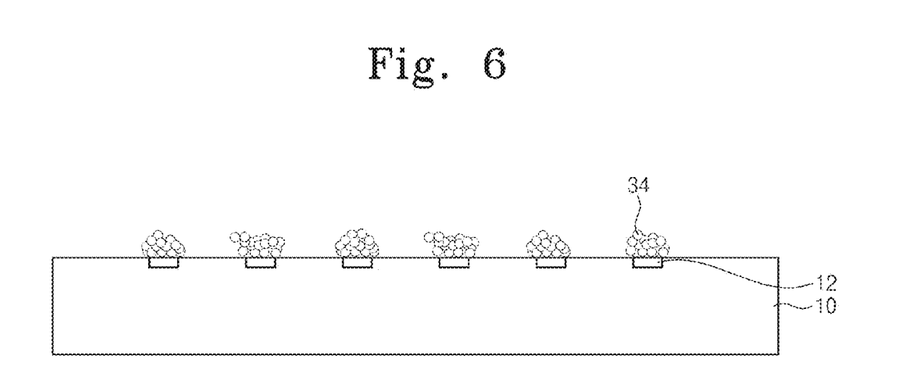

Referring to FIG. 6, the first resin 32 and the guide 20 may be removed. For example, the first resin 32 and the guide 20 may be removed using an organic solvent, such as alcohol. A portion of the solder powder 34, which is not aggregated, may be removed, along with the first resin 32. Since the first resin 32 is not cured in a subsequent process, it may remain after the reflow process of the solder powder 34.

Figure 10:
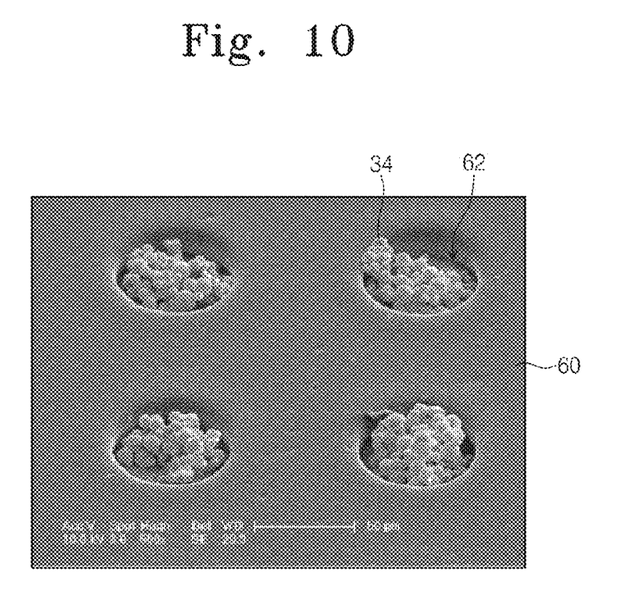
FIG. 10 is an image of solder powder aggregated on a PCB and FIG. 11 is an enlarged image of the aggregated solder powder.
Figure 11:
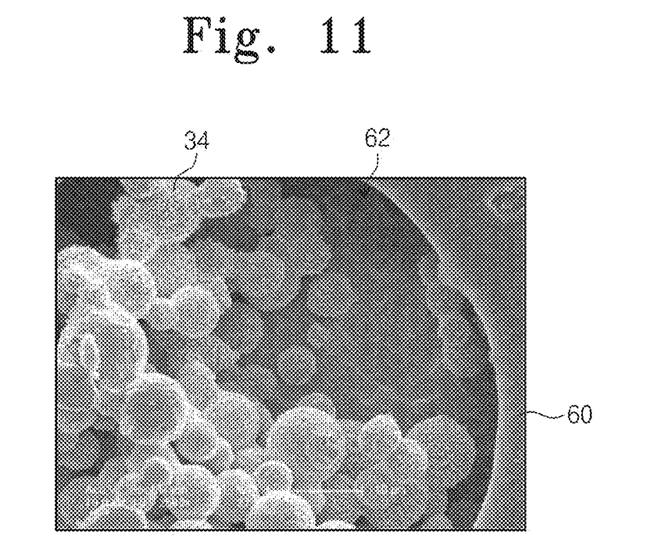

FIG. 10 is an image of the solder powder 34 aggregated on a PCB 60, and FIG. 11 is an enlarged image of the solder powder 34.

Referring to FIGS. 10 and 11, the solder powder 34 may be aggregated in a trench 62 of the printed circuit board 60. The solder powder 34 may fill the trench 62. The solder powder 34 in the trench 62 may be aggregated to be electrically connected to each other.

Figure 7:
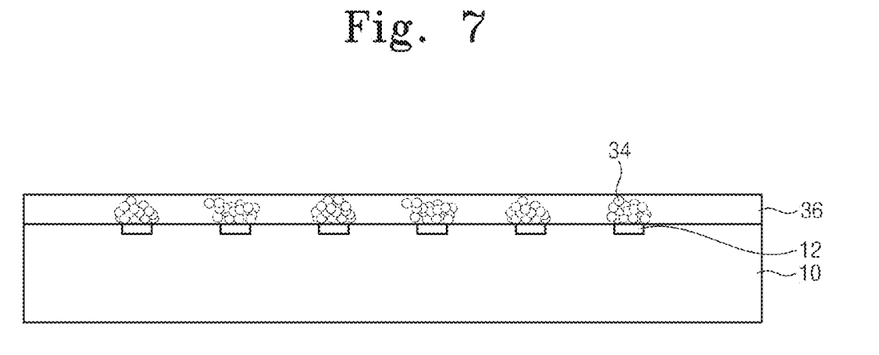

Referring to FIG. 7, a second resin 36 may be coated on the first substrate 10. The second resin 36 may be coated on the whole surface of the first substrate 10 by a spin coater. The second resin 36 may include a reductant.

Figure 8:
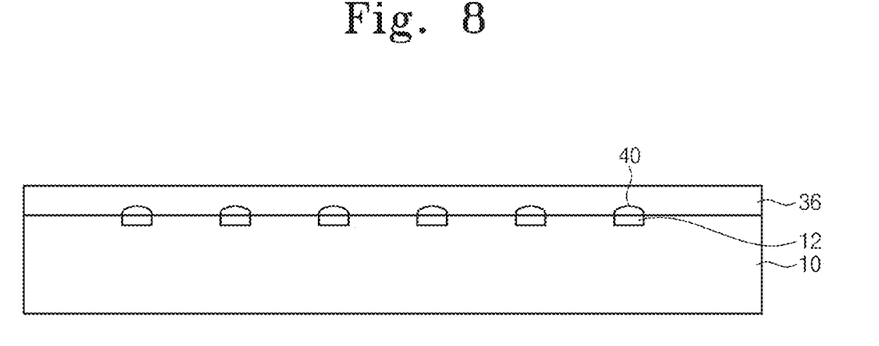

Referring to FIG. 8, the second resin 36 and the solder powder 34 may be heated to a temperature higher than a melting point of the solder powder 34, such that the solder powder 34 may be reflowed. The reflowed solder powder 34 may form a solder 40. The solder 40 may be formed to cover the whole top surface of the pad 12. In example embodiments, a surface of the solder 40 may be treated by the reductant in the second resin 36.

Figure 9:
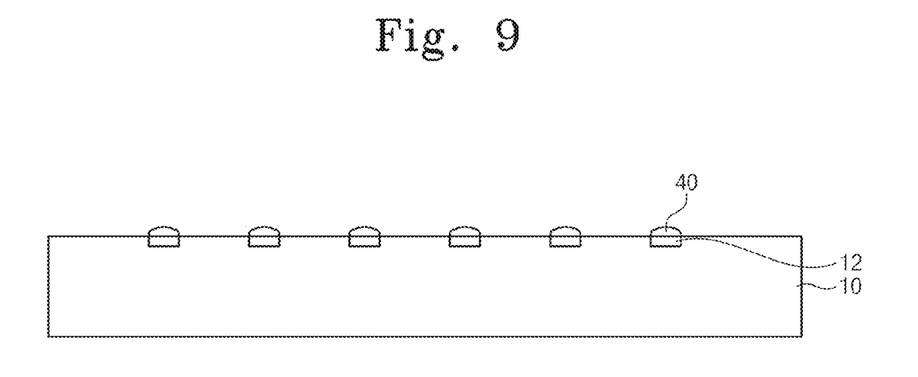

Referring to FIG. 9, the second resin 36 may be removed. For example, the second resin 36 may be removed by an organic solvent.

Figure 12:
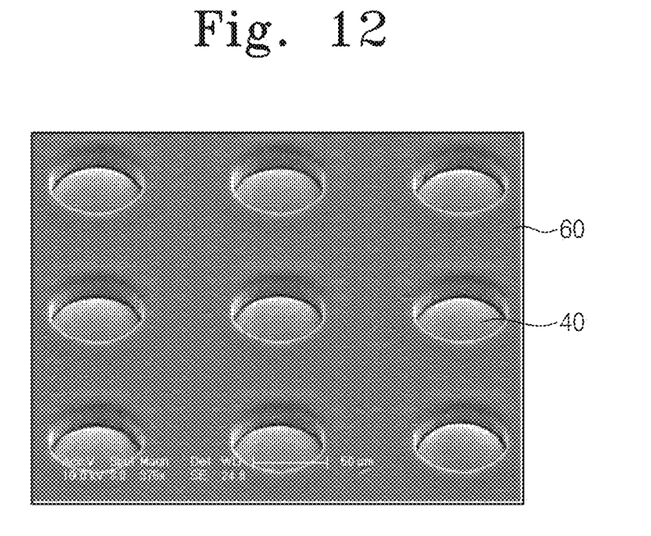
FIG. 12 is an image of a solder-on-pad structure provided on a PCB and FIG. 13 is an enlarged sectional image of the solder-on-pad structure of FIG. 12.
Figure 13:
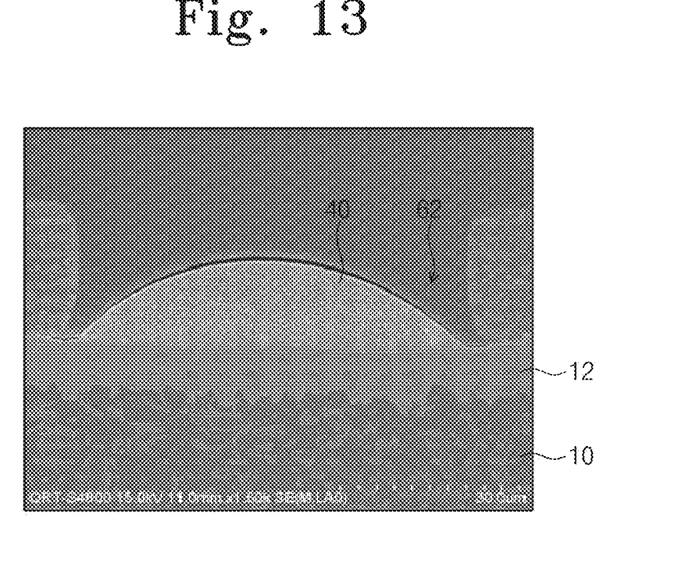

FIG. 12 is an image of the solder 40 provided on the PCB 60, and FIG. 13 is an enlarged sectional image of the solder 40 of FIG. 12.

Referring to FIGS. 12 and 13, the solder 40 may be bonded to the pad 12 of the printed circuit board 60. The pad 12 may be formed of a copper-containing layer. Further, the solder 40 may be formed of a copper-containing layer. Accordingly, the pad 12 and the solder 40 may be bonded to each other with a high attaching strength.

Figure 14:
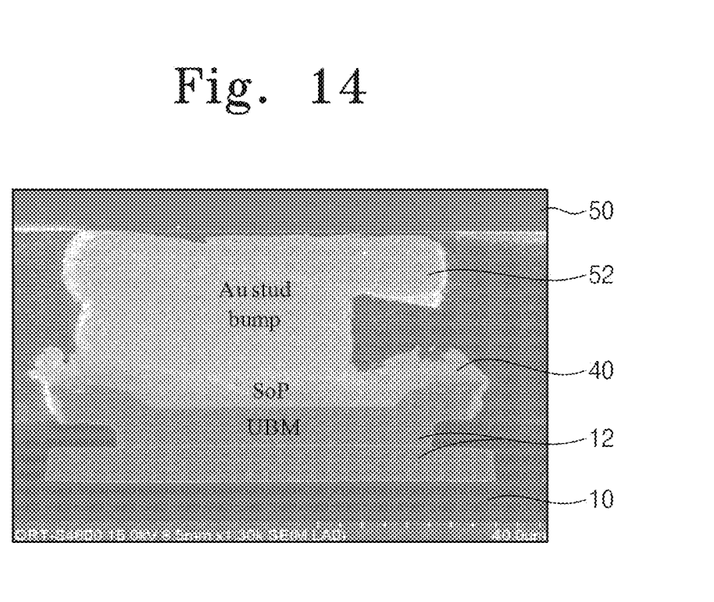
FIG. 14 is a sectional image illustrating a flip chip, in which a stud bump is bonded on a solder-on-pad structure.

FIG. 14 is a sectional image illustrating a flip chip, in which a stud bump 52 is bonded on the solder-on-pad structure according to example embodiments of the inventive concept.

Referring to FIG. 14, the stud bump 52 may be formed on the solder 40. The stud bump 52 may be bonded to the second substrate 50. Although not shown, a pillar may be bonded on the solder 40. Even in the case where an external force is applied to the second substrate 50 and the stud bump 52, it is possible to suppress the solder 40 from being detached from the pad 12. This may be because the solder 40 is connected to the pad 12 with a high attaching strength.

Accordingly, the flip-chip bonding method according to example embodiments of the inventive concept can be used to improve bonding or attachment reliability between the solder 40 and the pad 12.

Figure 15:
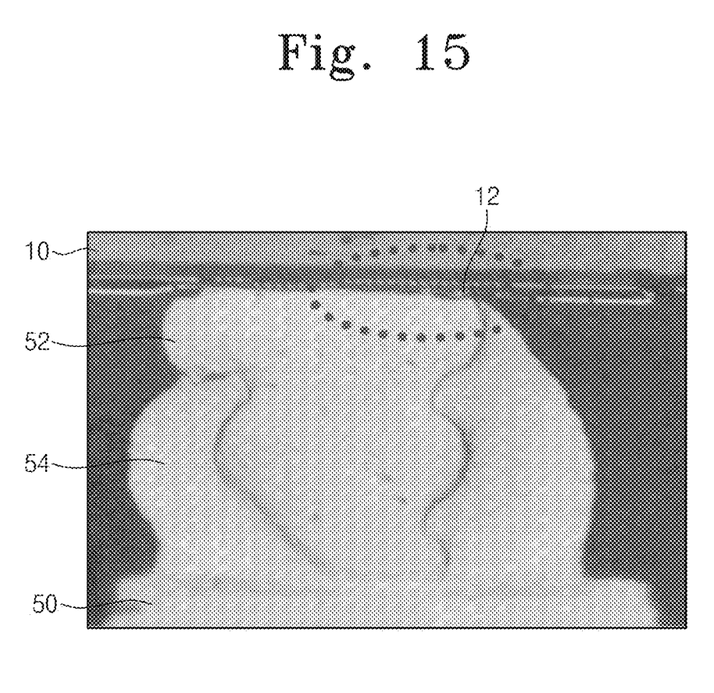
FIG. 15 is a sectional image illustrating a conventional flip chip, in which a stud bump is bonded on a pad.

FIG. 15 is a sectional image illustrating a conventional flip chip, in which the stud bump 52 is bonded on the pad 12.

Referring to FIG. 15, if an external force is applied to the second substrate 50 and the stud bump 52, the pad 12 and the stud bump 52 may be separated from each other with ease. The stud bump 52 may be easily peeled from the pad 12. To overcome this problem, the solder 40 may be formed between the pad 12 and the stud bump 52. The second substrate 50 may be jointed to the solder 40 by a solder bump 54. As described above, the solder 40 may be formed by a spontaneous aggregation of the solder powder 34, which may occur after the heating of the solder powder 34 to a temperature lower than a melting point thereof.

According to example embodiments of the inventive concept, a method of fabricating a solder-on-pad structure may include forming a solder bump maker on a pad of a substrate, and then, heating the solder bump maker to a temperature lower than a melting point thereof. As the result of the heating, a solder powder provided in the solder bump maker may be spontaneously aggregated on the metal pad of the substrate. This enables to form a thin solder bump having a height of 10 um or less, and consequently, to realize a solder-on-pad structure with improved reliability. Further, the process may be performed without any mask, and thus, it may be applied to a device with fine patterns. The aggregation of the solder powder can be simply achieved by the thermal treatment process, without necessity for an additional process. Therefore, according to example embodiments of the inventive concept, the solder-on-pad structure can be fabricated with improved productivity. The solder powder may include at least one of various metals, such as unitary, binary, or ternary solder.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a solder-on-pad structure, comprising:

providing a substrate with a pad;
coating a solder bump maker including a first resin and a solder powder on the substrate;
heating the solder bump maker to a temperature lower than a melting point of the solder powder, thereby aggregating the solder powder on the pad;
removing the first resin,
coating a second resin or a flux on the solder powder;
reflowing the solder powder; and
removing the second resin or the flux.

2. The method of claim 1, wherein the solder powder comprises a ternary solder.

3. The method of claim 2, wherein the ternary solder comprises SAC305 ($Sn_3Ag_{0.5}Cu$).

4. The method of claim 3, wherein the SAC305 is heated to 215° C. during the heating of the solder bump maker.

5. The method of claim 1, further comprising, forming a guide exposing the pad on the substrate and determining a height of the solder bump maker.

6. The method of claim 5, wherein the coating of the solder bump maker is performed by a printing process, and the guide is used to print the solder bump maker on a specific region of the substrate, where the pad is provided, during the printing process.

7. The method of claim 1, wherein the solder bump maker further comprises a reductant selected to remove a natural oxide layer from surfaces of the solder powder and the pad.

8. The method of claim 1, wherein the reflowing of the solder powder is performed to heat the solder powder to a temperature higher than a melting point thereof.

9. A flip-chip bonding method, comprising:
providing a substrate with a pad;
coating a solder bump maker including a first resin and a solder powder on the substrate;
heating the solder bump maker to a temperature lower than a melting point of the solder powder, thereby aggregating the solder powder on the pad;
removing the first resin;
coating a second resin or a flux;
reflowing the aggregated solder powder to form a solder bump on the pad; and
removing the second resin or the flux.

10. The method of claim 9, wherein the solder powder comprises a ternary solder made of SAC305 ($Sn_3Ag_{0.5}Cu$).

11. The method of claim 10, wherein the SAC305 is heated to 215° C. during the heating of the solder bump maker.

12. The method of claim 10, wherein the solder powder is heated to a temperature higher than the melting point during the reflowing of the aggregated solder powder.

13. The method of claim 9, wherein the substrate comprises a wafer provided with a trench.

* * * * *